United States Patent
Yamanaka et al.

(10) Patent No.: US 9,101,060 B2
(45) Date of Patent: Aug. 4, 2015

(54) STRUCTURE FOR PROTECTING ON-BOARD DEVICE

(75) Inventors: Kenshi Yamanaka, Aichi-ken (JP); Kouji Hotta, Miyoshi (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/344,121

(22) PCT Filed: Sep. 13, 2011

(86) PCT No.: PCT/JP2011/070792
§ 371 (c)(1),
(2), (4) Date: Mar. 11, 2014

(87) PCT Pub. No.: WO2013/038487
PCT Pub. Date: Mar. 21, 2013

(65) Prior Publication Data
US 2014/0345960 A1    Nov. 27, 2014

(51) Int. Cl.
| B60K 1/00 | (2006.01) |
| H05K 5/03 | (2006.01) |
| B60R 16/04 | (2006.01) |
| B60L 11/18 | (2006.01) |

(52) U.S. Cl.
CPC .. *H05K 5/03* (2013.01); *B60K 1/00* (2013.01); *B60L 11/1803* (2013.01); *B60R 16/04* (2013.01); *B60L 2210/42* (2013.01)

(58) Field of Classification Search
CPC ............ B60K 1/00; B60K 35/00; B60L 3/00; B60L 3/0007; B60L 3/003; B60R 16/04; B60R 2021/0004; B60R 2021/0009; B62D 25/082; B60Y 2306/01; B60Y 2400/61
See application file for complete search history.

(56) References Cited

U.S. PATENT DOCUMENTS

| 5,476,151 | A  | * | 12/1995 | Tsuchida et al. ............. 180/274 |
| 6,827,168 | B2 | * | 12/2004 | Miyazaki ..................... 180/68.5 |
| 7,802,643 | B2 | * | 9/2010  | Yajima ....................... 180/65.22 |
| 2005/0205316 | A1 | * | 9/2005 | Yamafuji ..................... 180/68.5 |
| 2009/0095557 | A1 |   | 4/2009 | Yajima |
| 2014/0084627 | A1 | * | 3/2014 | Yamanaka et al. ........ 296/187.09 |
| 2015/0021114 | A1 | * | 1/2015 | Hotta et al. .................. 180/279 |

FOREIGN PATENT DOCUMENTS

| JP | 2001-354040 | 12/2001 |
| JP | 2007-186083 | 7/2007 |
| JP | 2007-290479 | 11/2007 |
| JP | 2011-176223 | 9/2011 |

(Continued)

*Primary Examiner* — Katy M Ebner
(74) *Attorney, Agent, or Firm* — Finnegan, Henderson, Farabow, Garrett & Dunner, LLP (57) ABSTRACT

The present invention provides a structure for protecting a corner of a case of an inverter (an on-board device), and provides the structure for protection having improved assembling efficiency. The present Description discloses the structure for protecting a corner of a case of an inverter. The structure includes a protector for covering the corner, and a receiving portion provided on the case. The protector is fixed at least at two points arranged on a straight line on a first surface adjacent to the corner. The receiving portion is provided on a second surface adjacent to the corner. The receiving portion is provided at a position where the receiving portion receives an edge of the protector when the protector rotates around a straight line Pv passing through at least two fixed points.

4 Claims, 7 Drawing Sheets

(56) References Cited

FOREIGN PATENT DOCUMENTS

| JP | 2013-35466 | 2/2013 |
| WO | WO 2012/104721 A1 | 8/2012 |
| WO | WO 2012/160618 A1 | 11/2012 |
| WO | WO 2013/014745 A1 | 1/2013 |
| WO | WO 2013/021256 A2 | 2/2013 |

* cited by examiner

STRUCTURE FOR PROTECTING ON-BOARD DEVICE

CROSS-REFERENCE TO RELATED APPLICATIONS

This application is a national phase application of International Application No. PCT/JP2011/070792, filed Sept. 13, 2011, the content of which is incorporated herein by reference.

TECHNICAL FIELD

The present invention relates to a structure for protecting an on-board device. The on-hoard device is typically a battery, a controller, or an inverter.

BACKGROUND ART

In an engine compartment (also referred to as a front compartment) of an automobile, various devices (on-board devices) such as an engine, a motor, and their controllers are installed.

In recent years, along popularization of hybrid vehicles, an inverter for supplying power to the motor has also come to be arranged in the engine compartment (Patent document 1).

CITATION LIST

Patent Literature

Patent document 1: Japanese Patent Application Publication No. 2001-354040

SUMMARY OF INVENTION

When an automobile collides against an obstacle, an on-board device in the engine compartment may receive a large damage. Therefore, a structure for protecting the device from an impact of the collision is desired. Particularly, because a controller or an inverter of a motor handles a large current, a structure for protecting the controller or the inverter from the impact is desired to prevent a leakage of the current.

As one of methods for protecting the on-board device, it may be useful to install a protector at an outside of a case of the on-board device. The protector may be a metal plate, for example. Because the protector may be installed in a region that requires strength, it is not necessary to strengthen the case as a whole. The protector can meet requirements of different types of vehicles, by simply changing an installation position of the protector. Increasing the strength of the case of the on-board device by the protector in this way has some advantages.

When a corner of the case of the on-board vehicle is a protection range, a protector that covers the corner is prepared. Fixing the protector on two faces or three faces adjacent to the corner has poor assembling efficiency. This is because an operator must access the protector from two directions or three directions to fix the protector. A technique disclosed in the present Description provides a structure for protecting a corner of a case of an on-board device, the structure for protection having improved assembling efficiency.

The present Description discloses a structure for protecting a corner of a case of an on-board device. The structure includes a protector for covering the corner, and a receiving portion provided on the case. The protector is fixed to at least two points on a surface adjacent to the corner (one surface that is continuous to the corner; a first surface). The at least two points are arranged on a straight line. The receiving portion is provided on a separate surface adjacent to the corner (a separate surface that is continuous to the corner: a second surface), The receiving portion is provided at a position for receiving an edge of the protector when the protector rotates about the straight line (a straight line that passes through the at least two fixed points).

According to the above structure for protection, the protector is fixed on only the first surface. Because the operator can perform assembling work by only facing the first surface, assembling efficiency improves. Further, in fixing the protector, the receiving portion and the protector do not need to be in contact with each other. Preferably, the protector is fixed at two points. In this case, the operator may position the protector by paying attention to only the two points to be fixed. That is, the above structure also facilitates the positioning of the protector.

A case where the protector is fixed at two points on one surface is considered. When a vehicle collides against an obstacle and force is applied to the protector from an outside, the protector supported at the two points rotates about the straight line which passes through the two points. As a result, the edge of the protector is received by the receiving portion. Then, the protector is supported at three points including the fixed two points and the receiving portion, and therefore, becomes structurally stable. That is, when the protector rotates about the straight line that connects between the two fixed points, and the edge of the protector is received by the receiving portion, the receiving portion together with the two supporting points receives external force (impact force) applied to the protector. While the protector is supported (fixed) at the two points at the beginning, the protector is supported at the three points after the protector is rotated by a predetermined angle by receiving an impact. After the protector has come to be supported at the three points, the protector obtains strength to protect the case. The above scenario is also applied to a case where the protector is fixed at least at two points arranged on a straight line.

A representative shape of the receiving portion may be a projection protruded from the second surface or a groove provided on the second surface. The projection may be provided at a position where the edge of the rotating protector comes to be in contact with the projection. The groove may be provided at a position where the edge of the rotating protector is caught.

A typical representative application example of the structure for protection is protection of an inverter that is laid out in the engine compartment of an electric vehicle. For example, a battery, and a drive train on an upper surface of which the inverter is fixed are arranged laterally in the engine compartment. In this case, the battery and the inverter are adjacent to each other. As one of typical patterns of collision, there is a pattern in which an obstacle collides against the vehicle from a diagonally front direction of the vehicle. When the obstacle collides in such a pattern, the battery may hit against a corner in front of the inverter and facing the battery. When the above structure for protection is applied to the corner in front of the inverter and facing the battery, the inverter can be protected from collision of the above pattern. It should be noted that the term of "electric vehicle" includes a hybrid vehicle including both a traction motor and an engine for running.

Details of the technique disclosed in the present Description and further improvement are described in the subsequent description of the invention.

DESCRIPTION OF EMBODIMENTS

Figure 1:
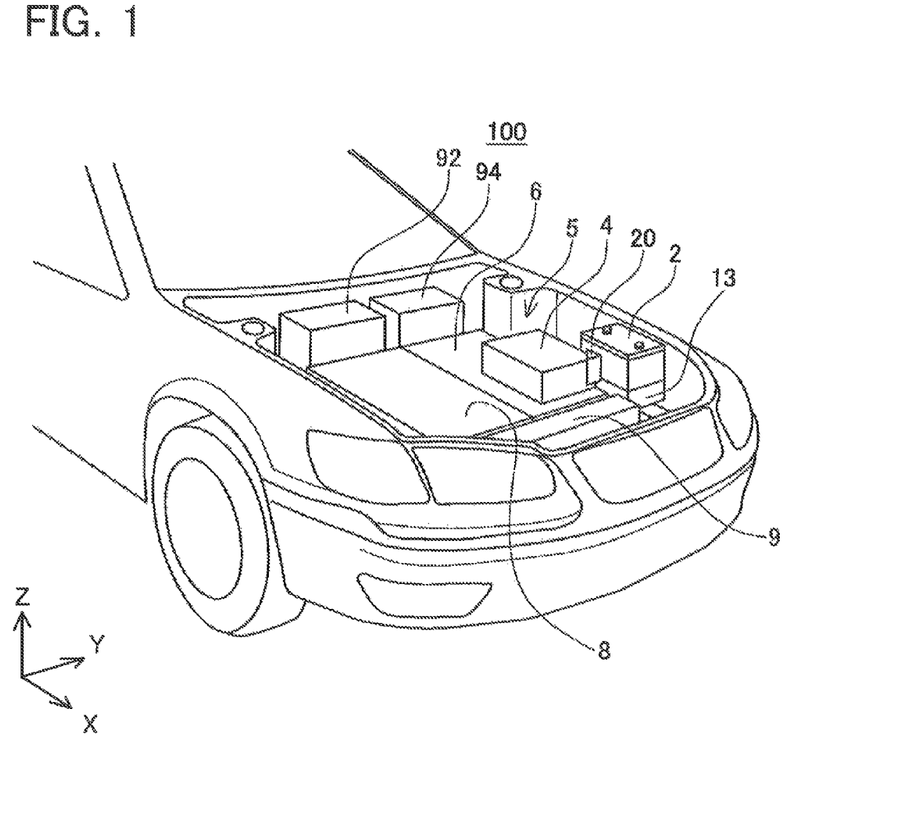
FIG. 1 is a schematic perspective view of a device layout in an engine compartment.
Figure 2:
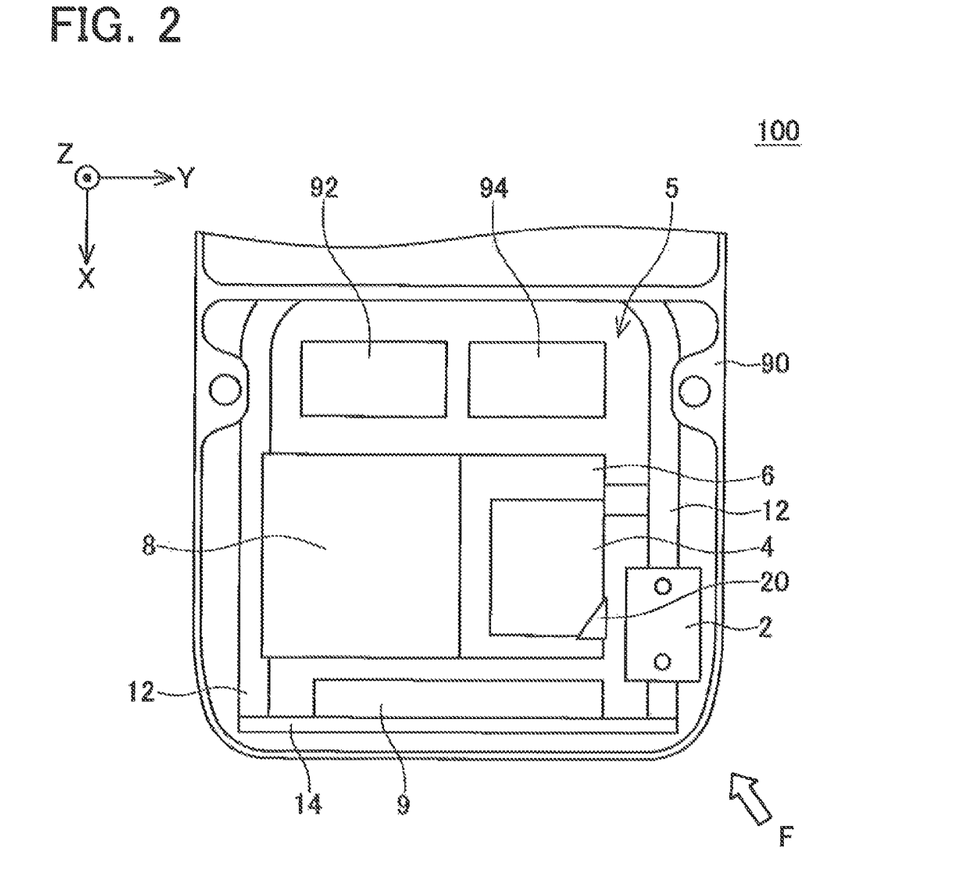
FIG. 2 is a schematic plan view of the device layout in the engine compartment.

First, an example of a layout of devices that are installed in an engine compartment (a front compartment) of a vehicle is described. FIG. 1 is a schematic perspective view of a device layout in an engine compartment 5 of a vehicle 100, and FIG. 2 is a schematic plan view. In all drawings, an X axis corresponds to a front direction of the vehicle, a Y axis corresponds to a lateral direction of the vehicle, and a Z axis corresponds to an upper (vertically above) direction of the vehicle.

The vehicle 100 is a hybrid vehicle including an engine and a motor. Main devices that are installed in the engine compartment 5 are an engine 8, a drive train 6 including the motor, a planetary gear, and a differential gear, a sub-battery 2, a radiator 9, and an inverter 4. A reference numeral 92 denotes a relay box, and a reference numeral 94 denotes a compressor of an air conditioner. The engine 8 and the drive train 6 are fixed to side frames 12 (side members) that configure a frame of the vehicle. The radiator 9 is fixed to a front frame 14 (a front bumper reinforcement) that configures a part of the frame. The sub-battery 2 is fixed to the side frame 12 via a spacer 13.

The sub-battery 2 in the engine compartment 5 outputs a voltage of 12V. The sub-battery 2 supplies power to electric circuits in the air conditioner, a wiper, head lights, and the inverter 4. A main battery for supplying drive power to the motor is not arranged in the engine compartment 5, but is arranged in a rear compartment (a luggage room), or at a lower part of a rear seat. Output of the main battery exceeds 50V Representatively, an output voltage of the main battery is about 200V. In general, the sub-battery 2 for supplying low voltage power (a voltage of approximately less than 50V) to the electric circuits, a power steering, etc. other than high voltage power (a voltage exceeding 50V) to be supplied to a motor (a vehicle drive motor) is also referred to as an accessory battery or an auxiliary battery.

The vehicle 100 is a hybrid vehicle. In the drive train 6, there are provided a motor generator, the planetary gear, and the differential gear. The planetary gear changes over output of the engine and output of the motor, and transmits changed output to the differential gear, or adds both the output of the engine and the output of the motor, and transmits the added output to the differential gear. The drive train 6 is also referred to as a power train or a transaxle (T/A).

The inverter 4 for controlling the motor in the drive train 6 is fixed to an upper surface of the drive train 6. This arrangement has an advantage in that a length of a conducting cable at a high voltage for connecting between the inverter 4 and the motor in the drive train 6 can be shortened. The inverter 4 converts a voltage supplied from the main battery into a voltage suitable for driving the motor, and then converts the converted voltage into an alternating current. That is, more specifically, the inverter 4 includes a voltage converter circuit and an inverter circuit. The inverter 4 also has a function of converting deceleration energy at a braking time into electrical energy. Power obtained from the deceleration energy is referred to as regenerative energy. The regenerative energy is accumulated in the main battery. Because the inverter 4 includes a voltage converter circuit, an inverter circuit, and a circuit for obtaining the regenerative energy, the inverter 4 is also referred to as a power controller.

In the inverter 4, a capacitor for smoothing output of a DCDC converter circuit and output of the inverter circuit are incorporated. Normally, such a capacitor has capacitance equal to or larger than hundred farads. Further, in the inverter 4, there is provided an emergency discharge circuit that discharges the capacitor upon detecting an impact. That is, the "inverter" in the present Description may include not only the inverter circuit but also an additional circuit associated with motor control.

Because power of large capacitance is accumulated in the inverter 4 in this way, it is preferable to protect the inverter 4 from the impact upon the collision as much as possible. The sub-battery 2 and the drive train 6 on the upper surface of which the, inverter 4 is fixed are arranged laterally in the engine compartment 5. When an obstacle enters from a direction indicated by an arrowhead F shown in FIG. 2, for example, the sub-battery 2 is brought into collision with the inverter 4. Therefore, the protector 20 is installed at a corner (a corner that faces the sub-battery 2) of the case of the inverter 4.

Figure 3:
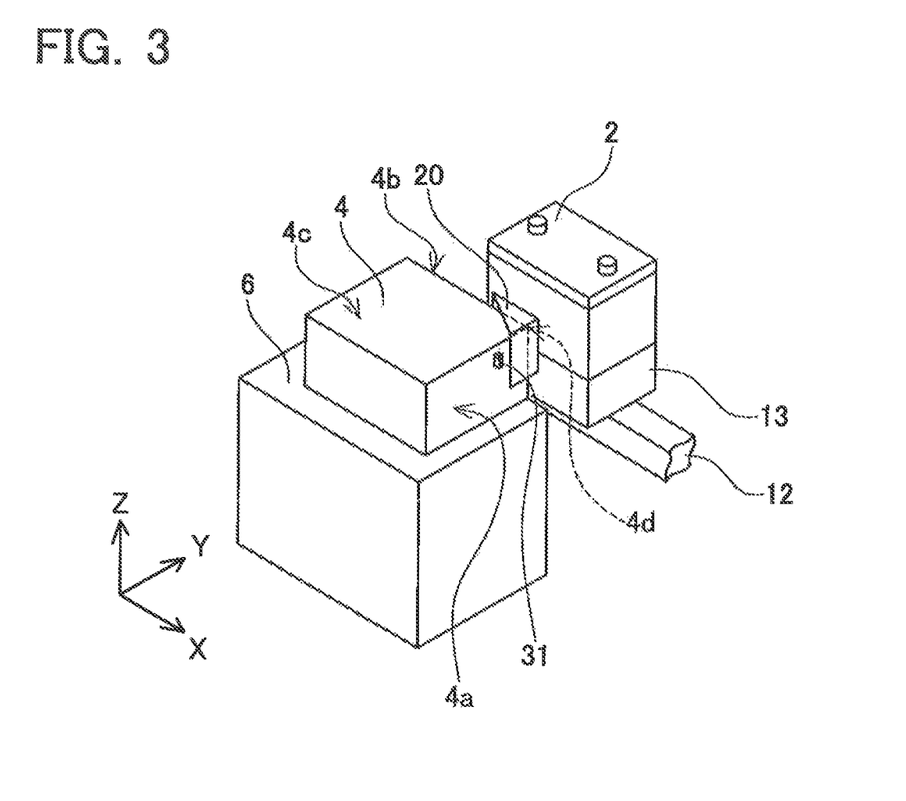
FIG. 3 is a perspective view of a layout of an inverter and a sub-battery.
Figure 4:
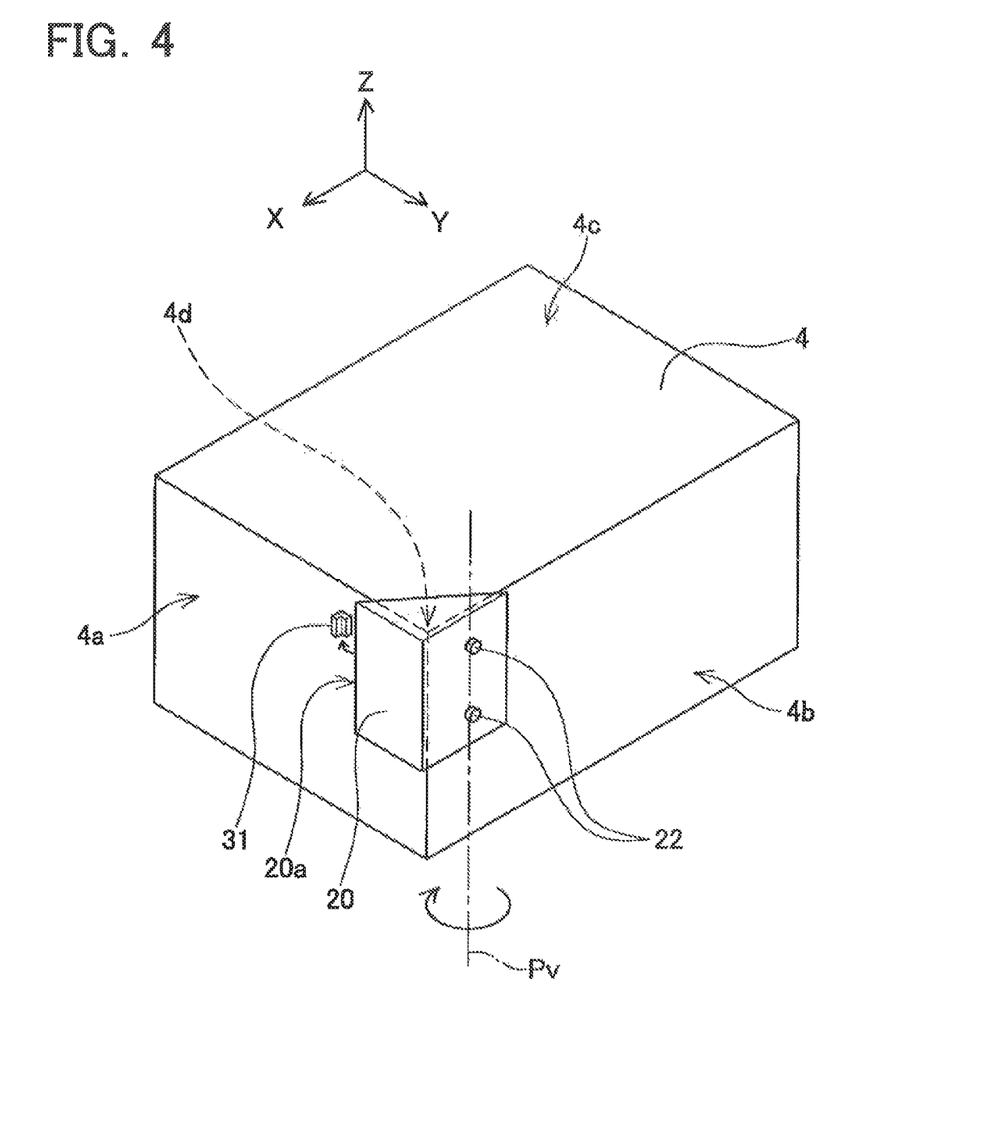
FIG. 4 is a perspective view of the inverter installed with a protector.

(First Embodiment) A structure for protection including the protector 20 is described. FIG. 3 is a perspective view of a layout of the inverter 4 and the sub-battery 2. FIG. 4 is a perspective view of the inverter 4 installed with a protector 20. The protector 20 is a metal plate made of aluminum, for example. The protector 20 is installed to cover a corner 4d at a front side of the vehicle, the corner 4d facing the sub-battery 2. The corner 4d is a vertex where a front surface 4a, a side surface 4b (a side surface that faces the sub-battery 2), and an upper surface 4c, respectively, of a case of the inverter 4 intersect. As shown in FIG. 4, the protector 20 is fixed with bolts at two points (fixed points 22) on the side surface 4b that faces the sub-battery 2. That is, the protector 20 is supported at the two points.

Figure 5:
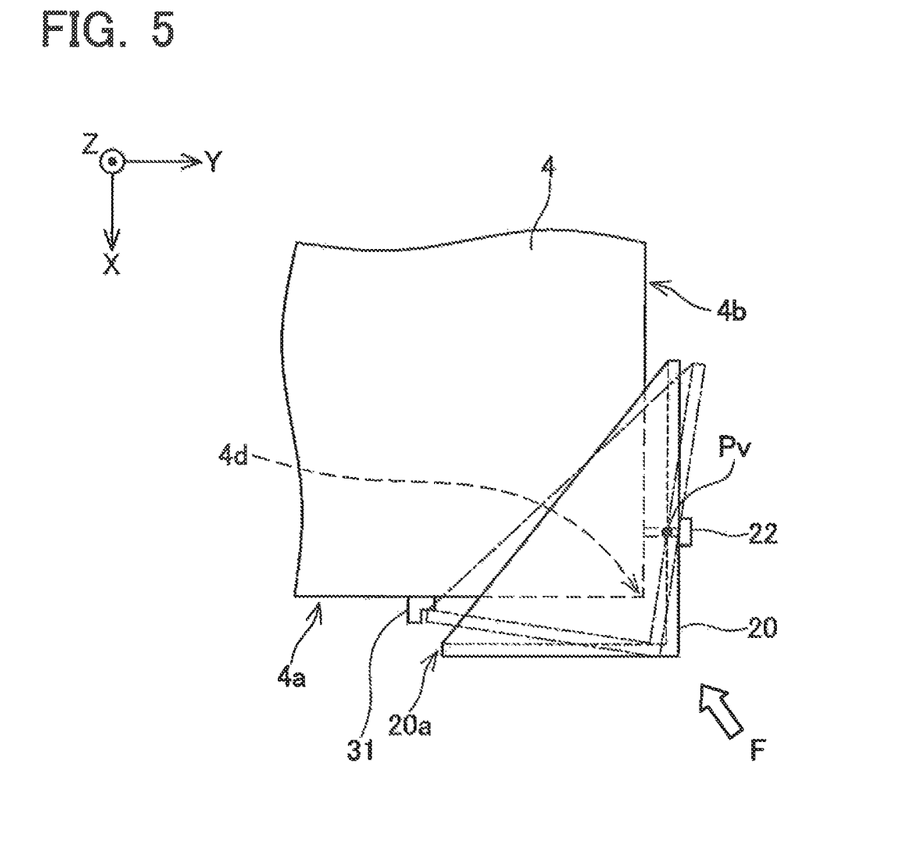
FIG. 5 is an explanatory view of a state in which the protector is rotated.

On the other surface (the front surface 4a of the case) of the inverter 4, a receiving portion 31 is provided. The receiving portion 31 is an L-shaped projection (a hooked projection). When the protector 20 receives force from an outside, the protector 20 rotates about an axis of a straight line Pv that passes through the two supporting points 22. When the protector 20 rotates, an edge 20a is appropriately caught by the receiving portion 31. FIG. 5 shows a state in Which the protector 20 is rotated. The straight line Pv is extended along the Z axis of a coordinate axis in the drawing. Upon receiving external force from a direction of an arrowhead F, the protector 20 rotates within an XY plane. Then, the edge 20a (the edge of the protector 20) that faces the front surface 4a of the inverter 4 moves toward the front surface 4a, and is brought into contact with a recess of the receiving portion 31. As shown in FIG. 5, when the edge 20a is caught by the receiving portion 31, the protector 20 is supported at three points including the two supporting points 22 and the receiving portion 31, and can sufficiently bear the external force. Consequently, the inverter 4 (particularly, the corner 4d of the case) is protected from an impact.

As described above, the structure for protection disclosed in the present Description is configured by the protector 20 that covers the corner 4d of the case of the inverter 4, and the receiving portion 31 provided in the case of the inverter 4. The protector 20 is fixed at the two points (fixed points 22) on a first surface (the side surface 4b) adjacent to the corner 4d. The receiving portion 31 is provided on a second surface (the side surface 4a) adjacent to the corner 4d, at a position where the receiving portion 31 receives the edge 20a of the protector 20 when the protector 20 rotates about the straight line Fv that connects between the two fixed points 22.

A surface that supports the protector 20 is not limited to the side surface 4b. Further, a surface on which the receiving portion 31 is provided is not limited to the front surface 4a. It is sufficient that a surface that supports the protector 20 and a surface on which the receiving portion 31 is provided are two surfaces among the three surfaces that intersect at the corner 4d to be protected. An on-board device that the protector 20 is to protect is not limited to the inverter 4. That is, the structure for protection disclosed in the present Description includes a protector that covers a corner to be protected of an on-board device, and the protector is fixed at two points on a first surface that is in contact with the corner of the case of the on-board device. The receiving portion for receiving the edge of the protector when the protector rotates is provided on a second surface that is in contact with both the corner and the first surface, as the second surface of the case of the on-board device. The receiving portion 31 is not limited to a projection, and may be a groove in which the protector is engaged. Next, a second embodiment that employs a groove as the receiving portion 31 is described.

Figure 6:
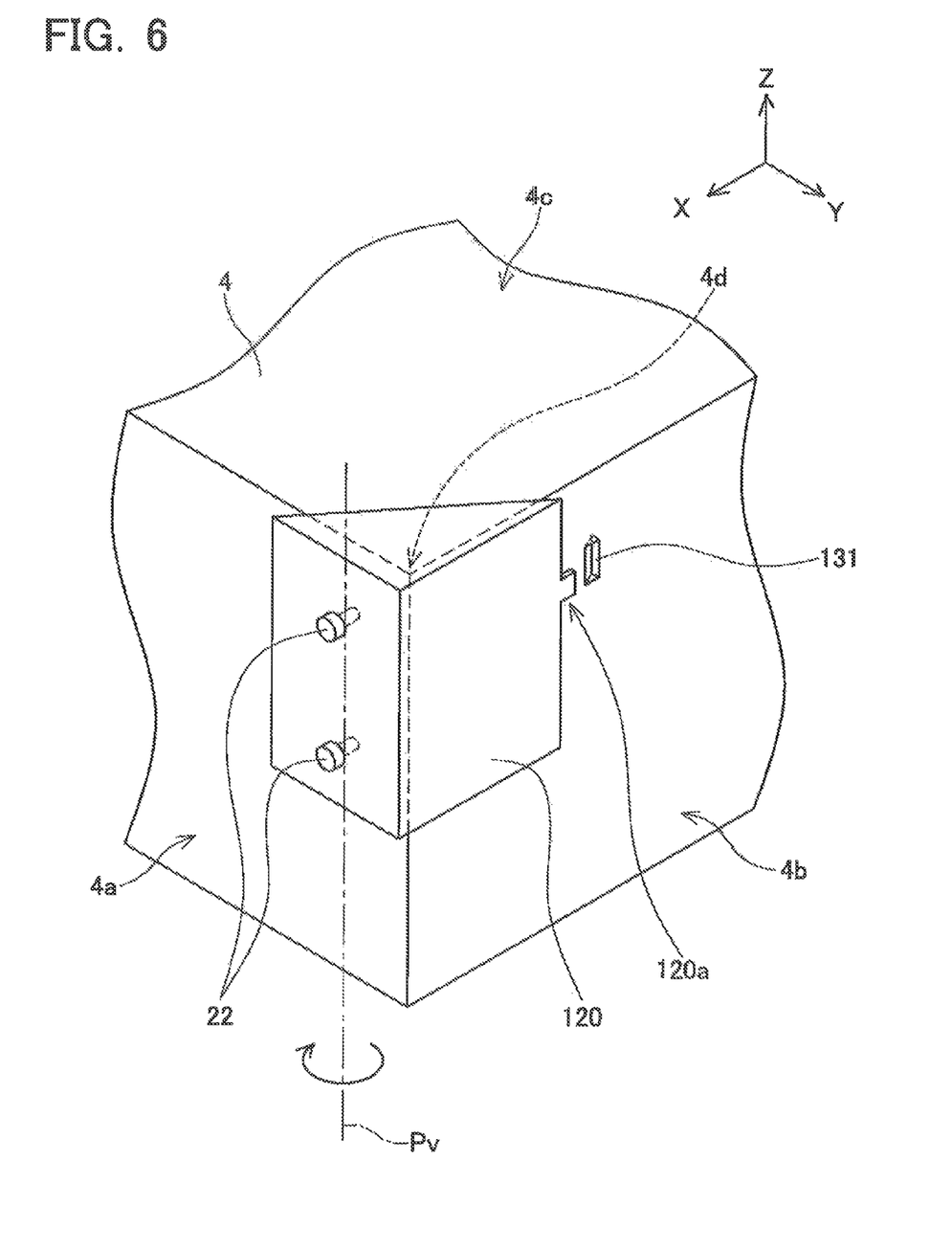
FIG. 6 is an explanatory view of a structure for protection according to a second embodiment.

(Second Embodiment) FIG. 6 shows a structure for protection according to the second embodiment. A protector 120 protects the corner 4d of the inverter 4, in a similar manner to that in the first embodiment. The protector 120 is fixed with bolts at two points (the fixed points 22), on the front surface 4a (a first surface) of the inverter 4. When external force is applied to the protector 120, the protector 120 rotates about the axis of the straight line Pv that connects between the two supporting points 22. A receiving portion 131 is provided on the side surface 4b (a second surface) of the inverter 4. The receiving portion 131 is a groove provided on the side surface 4b. A projection 120a is provided at an edge of the protector 120 corresponding to the receiving portion 131. When the protector 120 rotates about the axis of the straight line Pv, the projection 120a is engaged with the receiving portion 131. Consequently, the protector 120 is supported at three points— the two fixed points 22 and the receiving portion 131—and firmly protects the corner 4d.

Advantages of the structure for protection according to the embodiments are described.

The protector is fixed at two points on one surface of the on-board device. The operator who assembles a vehicle is just required to assemble the protector by facing the one surface, without operating by facing a plurality of surfaces. The structure for protection disclosed in the present Description has satisfactory assembling workability. While positioning the protector by fixing at three or more points is troublesome, positioning by fixing at only two points is remarkably easy. For example, in a case of fixing the protector with bolts at three or more points, large positional tolerance needs to be secured in bolt holes provided in the protector. That is, a hole much larger than a diameter of a bolt needs to be formed. This is because when the protector is fixed at two points, a position of the protector is fixed, and a position of the remaining one hole cannot be adjusted. When the protector is fixed with bolts in holes much larger than a diameter of each bolt, the strength may decrease. On the other hand, in the case of fixing the protector at only two points, the positional tolerance of the bolt hole may be small. When external force is applied to the protector, the protector rotates, and the edge is brought into contact with the receiving portion. As a result, the protector is firmly supported at three points, namely the two fixed points and the receiving portion, and protects the corner from external force.

Figure 7:
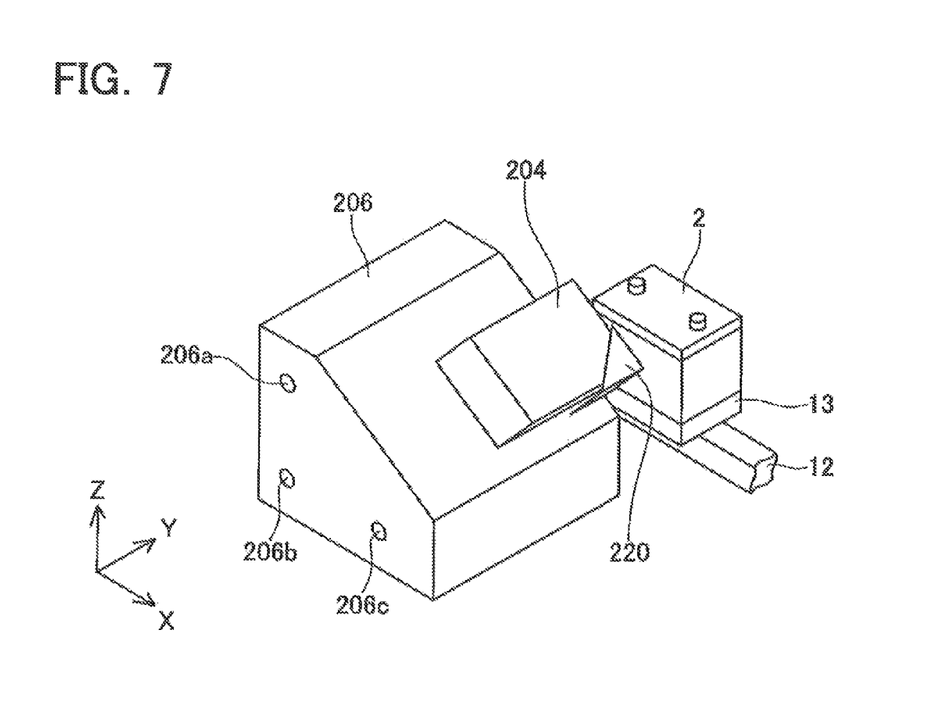
FIG. 7 is a perspective view of a layout of an inverter and a sub-battery according to a modification.

(Modification) A modification of a layout of an inverter (an on-board device) including a protector is described. FIG. 7 shows a modification of a layout of an on-board device including a protector in an engine compartment. A protector 220 covers a corner of an inverter 204 for supplying power to motors (not shown) provided in a drive train 206. The drive train 206 is a hybrid transaxle that is generally called a double shaft type. The drive train 206 incorporates two motors (or motor generators) and a differential gear. Main shafts 206a and 206b of the two motors and a shaft 206c of the differential gear are extended in parallel. As is apparent from a coordinate system shown in FIG. 1 and a coordinate system shown in FIG. 7, the drive train 206 is arranged so that the shafts 206a, 206b, and 206c are extended in a lateral direction (a Y axis direction) of the vehicle. As shown in FIG. 7, the drive train 206 has an upper surface tilted front-down as observed from a side surface (as observed from the Y axis direction). The upper surface tilted front-down is specific to a double-shaft type drive train having the three shafts 206a, 206b, and 206c.

The inverter 204 is fixed to the upper surface tilted front-down. That is, the inverter 204 is lower at a front side thereof than at a rear side, and is arranged to be tilted front-down. A front-upper corner of the inverter 204 faces a side surface of the battery 2. The protector 220 is installed on the inverter 204 so as to cover the front-upper corner. When the vehicle collides, the front-upper corner of the inverter 204 hits against the sub-battery 2. The protector 220 installed on the front-upper corner protects the inverter 204.

Notable points relating to the technique disclosed in the present Description are described. The protector may be fixed to a surface of a separate device continuous to one surface of the inverter. For example, as can be understood from FIGS. 1 to 3, the side surface 4b of the inverter 4 and the side surface of the drive train 6 are continuous on one plane. Therefore, from a viewpoint of fixing the protector, the side surface of the drive train 6 is substantially equal to the side surface of the inverter 4. The protector may be fixed to one surface of the inverter 4, and a separate surface continuous on a plane to the one surface of the inverter 4. That is, it is sufficient that the protector in the structure for protection disclosed in the present Description is fixed at two points on a first surface (including a side surface of a separate device that is continuous to the first surface on a pane) adjacent to the corner of the on-board device.

The protector in the embodiments is fixed at two points on one surface. Although the protector is most preferably fixed at two points, the protector may be also fixed at a plurality of positions arranged on a straight line. For example, in FIG. 4, the protector 20 may be fixed at three or more positions arranged on the straight line Pv. Further, in FIG. 6, for example, the protector 120 may be fixed at three or more positions arranged on the straight line Pv.

A shape of the receiving portion is not limited to a projection and a groove. It is sufficient that the receiving portion has a shape in which the edge of the protector can be stopped without sliding. The receiving portion may be a hook for example.

The protector may be made of other metal than aluminum. For example the protector may be made of a titanium alloy.

The protector may not be made of a metal. For example, the protector may be made of a carbon fiber reinforced plastic.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed above may be utilized separately or in conjunction with other features and teachings to provide improved protecting structure.

Moreover, combinations of features and steps disclosed in the detail description above may not be necessary to practice the invention in the broadest sense, and are instead taught merely to particularly describe representative examples of the invention. Furthermore, various features of the above-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Specific examples of the present invention has been described in detail, however, these are mere exemplary indications and thus do not limit the scope of the claims. The an described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A structure for protecting an inverter fixed on a top surface of a drive train arranged laterally adjacent to a battery in an engine compartment, the structure comprising a protector configured to cover a front corner of the inverter facing the battery, wherein:
   the protector is fixed to at least two points on a first surface adjacent to the corner, the two points being arranged on a straight line, and
   a receiving portion is provided on a second surface of the inverter adjacent to the corner, the receiving portion is configured to receive an edge of the protector when the protector rotates on the straight line passing through the at least two fixed points.

2. The structure according to claim 1, wherein the receiving portion receives external force applied on the protector when the protector rotates on the straight line passing through the at least two fixed two points and the receiving portion receives the edge of the protector.

3. The structure according to claim 1, wherein the receiving portion includes a projection projected from the second surface or a groove provided on the second surface, the groove being configured to catch the edge of the protector when the protector rotates.

4. The structure according to claim 2, wherein the receiving portion includes a projection projected from the second surface or a groove provided on the second surface, the groove being configured to catch the edge of the protector when the protector rotates.

* * * * *